United States Patent
Hebert

(10) Patent No.: US 6,215,152 B1
(45) Date of Patent: Apr. 10, 2001

(54) MOSFET HAVING SELF-ALIGNED GATE AND BURIED SHIELD AND METHOD OF MAKING SAME

(75) Inventor: Francois Hebert, San Mateo, CA (US)

(73) Assignee: CREE, Inc., Durham, NC (US)

( * ) Notice: Subject to any disclaimer, the term of this patent is extended or adjusted under 35 U.S.C. 154(b) by 0 days.

(21) Appl. No.: 09/130,192

(22) Filed: Aug. 5, 1998

(51) Int. Cl.⁷ ................................................. H01L 29/72
(52) U.S. Cl. ................ 257/340; 257/249; 257/329; 257/333; 257/335; 257/409; 257/488; 257/487; 257/491; 257/508; 438/159; 438/197; 438/267; 438/299; 438/454
(58) Field of Search ..................... 257/249, 329, 257/333, 335, 340, 409, 488, 487, 491, 508; 438/159, 197, 267, 299, 454

(56) References Cited

U.S. PATENT DOCUMENTS

| | | | |
|---|---|---|---|
| 4,455,565 | 6/1984 | Goodman et al. | 357/23.4 |
| 5,067,000 * | 11/1991 | Eimori et al. | 357/53 |
| 5,367,189 * | 11/1994 | Nakamura | 257/508 |
| 5,430,314 | 7/1995 | Yilmaz | 257/328 |
| 5,521,419 * | 5/1996 | Wkamiya et al. | 257/394 |
| 5,912,490 * | 6/1999 | Hebert et al. | 257/340 |
| 5,918,137 | 6/1999 | Ng et al. | 438/454 |
| 6,001,710 | 12/1999 | Francois et al. | 438/454 |

* cited by examiner

*Primary Examiner*—Eddie C. Lee
*Assistant Examiner*—Matthew E. Warren
(74) *Attorney, Agent, or Firm*—Townsend and Townsend and Crew LLP; Henry K. Woodward

(57) ABSTRACT

A MOSFET has a buried shield plate under the gate and over the drain with the gate being formed on the periphery of the buried shield plate as a self-aligned structure with minimal or no overlap of the gate over the shield plate. Methods of fabricating the MOSFET are disclosed.

15 Claims, 12 Drawing Sheets

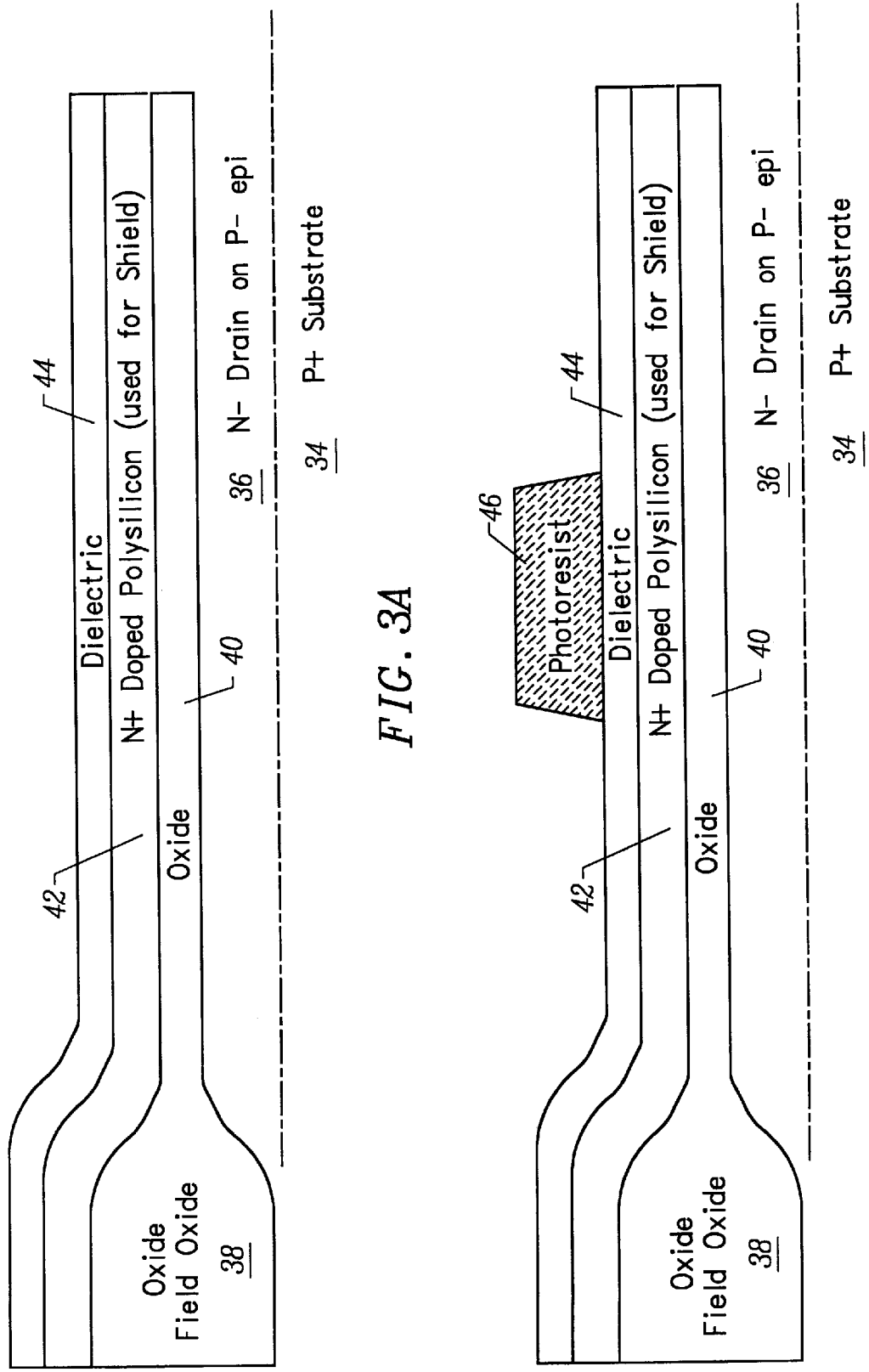

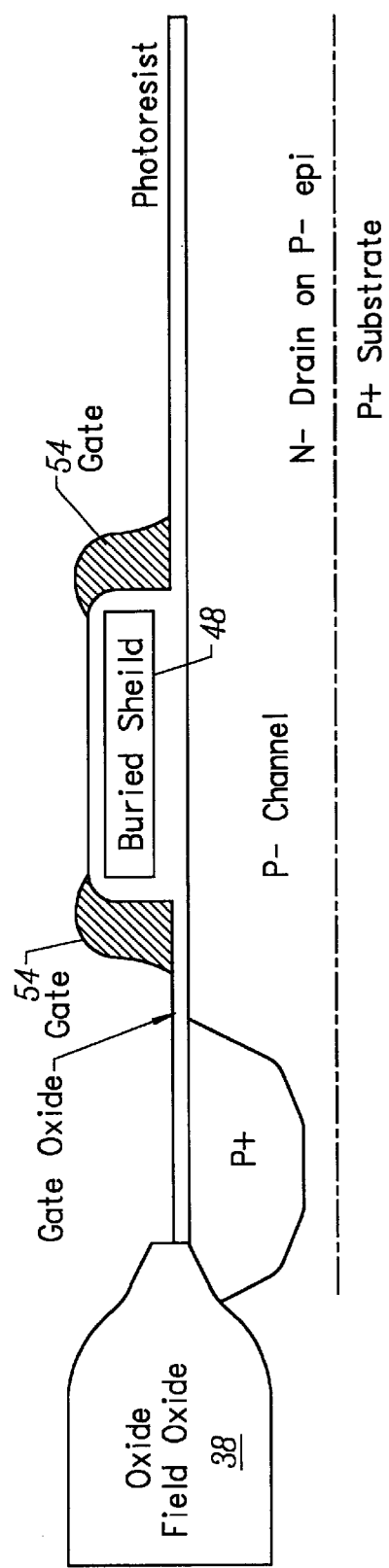
FIG. 3E
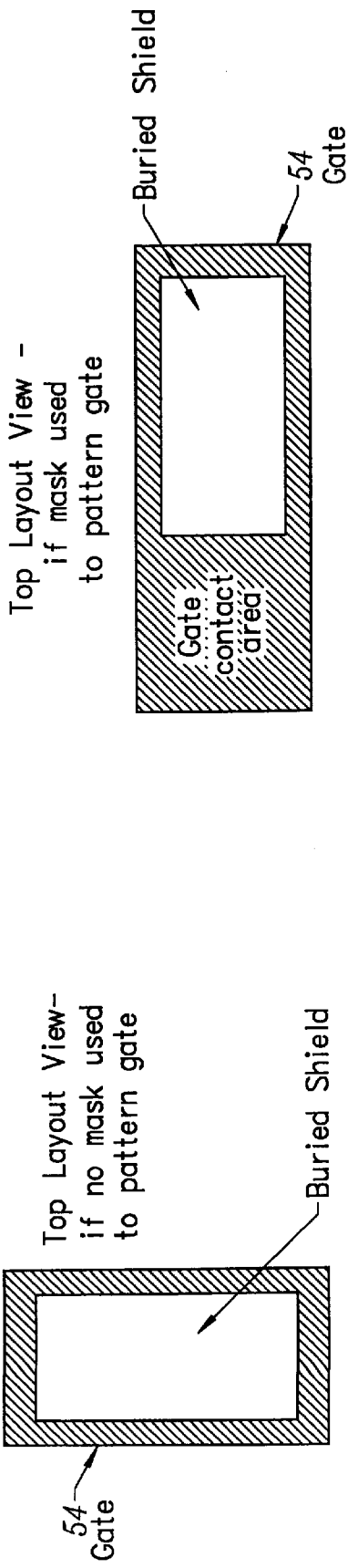
FIG. 4B
FIG. 4A

MOSFET HAVING SELF-ALIGNED GATE AND BURIED SHIELD AND METHOD OF MAKING SAME

BACKGROUND OF THE INVENTION

This invention relates generally to semiconductor field effect transistors and fabrication processes, and more particularly the invention relates to field effect transistors having gate-drain shields to reduce capacitative coupling. The invention has particular applicability to RF/microwave power MOSFET transistors including an extended drain MOSFET, vertical DMOS transistor, and lateral DMOS transistor.

The gate to drain feedback capacitance (Cgd or Crss) of any MOSFET device must be minimized in order to maximize RF gain and minimize signal distortion. The gate to drain feedback capacitance is critical since it is effectively multiplied by the voltage gain of the device or $C_{effective}$=Crss (1+gm $R_L$) where gm is the transconductance of the device and $R_L$ is the load resistance. The gate length must be minimized also to reduce transit time, increase transconductance, and reduce the on-resistance of the device.

Sub-micron narrow gate lithography can be used to enhance the characteristics of the MOSFET device, but fabrication of such device requires the use of very expensive wafer stepper systems.

Heretofore the use of a Faraday shield made of metal or polysilicon formed over the gate structure has been proposed as disclosed in U.S. Pat. No. 5,252,848. As shown in FIG. 1, a lateral DMOS transistor including an N+ source 10, an N+ drain 12, and an N− drain extended region 14 are separated by a P channel region 16 over which is formed a gate electrode 18 separated from the channel region 16 by gate oxide 20. In accordance with the U.S. Pat. No. 5,252,848 patent, the source metal contact 22 extends over gate 18 and is isolated therefrom by an insulative layer 24. The extended source metal 22 provides a Faraday shield between the gate 18 and the drain metal 26 thus reducing gate-drain capacitance. However, substantial gate-drain capacitance exists between gate 18 and the N− drain region 14 as illustrated at 28.

Spectrian (Assignee of the present application) has introduced a buried shield LDMOS transistor as illustrated in FIG. 2 in which gate-drain shielding is enhanced by providing a buried shield 30 which underlies gate 18 to reduce the capacitance 28 of FIG. 1. Further, a buried shield metal 30 is placed on the surface of insulator 24 to reduce capacitance between gate 18 and drain metal 26. However, the overlap of gate 18 over buried shield 30 results in higher input capacitance for the device.

Thus, there is a high cost of scaling down gate dimensions to try and minimize gate-drain capacitance. The described prior art devices using Faraday shields do not completely minimize the gate-drain capacitance, and prior art structures cannot be successfully applied to vertical DMOS devices. The overlap of the gate over the shield in the structure of FIG. 2 results in a higher input capacitance.

SUMMARY OF THE INVENTION

In accordance with the present invention, a MOSFET has a buried shield plate under the gate and over the drain with the gate being formed on the periphery of the buried shield plate as a self-aligned structure with minimal or no overlap of the gate over the shield plate.

In fabricating the MOSFET in accordance with the invention, the buried shield is first defined and then gate material is deposited over the buried shield with a dielectric therebetween. Excess gate material is removed by anisotropic etching thereby leaving gate material around the periphery of the buried shield. A non-critical mask is then employed to protect the gate material on the source side over the channel, and then the exposed gate material is removed by etching. The resulting structure has minimal or no overlap of gate material over the buried shield.

The invention and objects and features thereof will be more readily apparent from the following detailed description and appended claims when taken with the drawing.

BRIEF DESCRIPTION OF THE DRAWINGS

FIGS. 3A–3I are section views illustrating steps in fabricating a LDMOS transistor in accordance with one embodiment of the invention.

FIGS. 4A and 4B are plan views of gate material in FIG. 3E.

DETAILED DESCRIPTION OF THE ILLUSTRATIVE EMBODIMENTS

Figure 1:
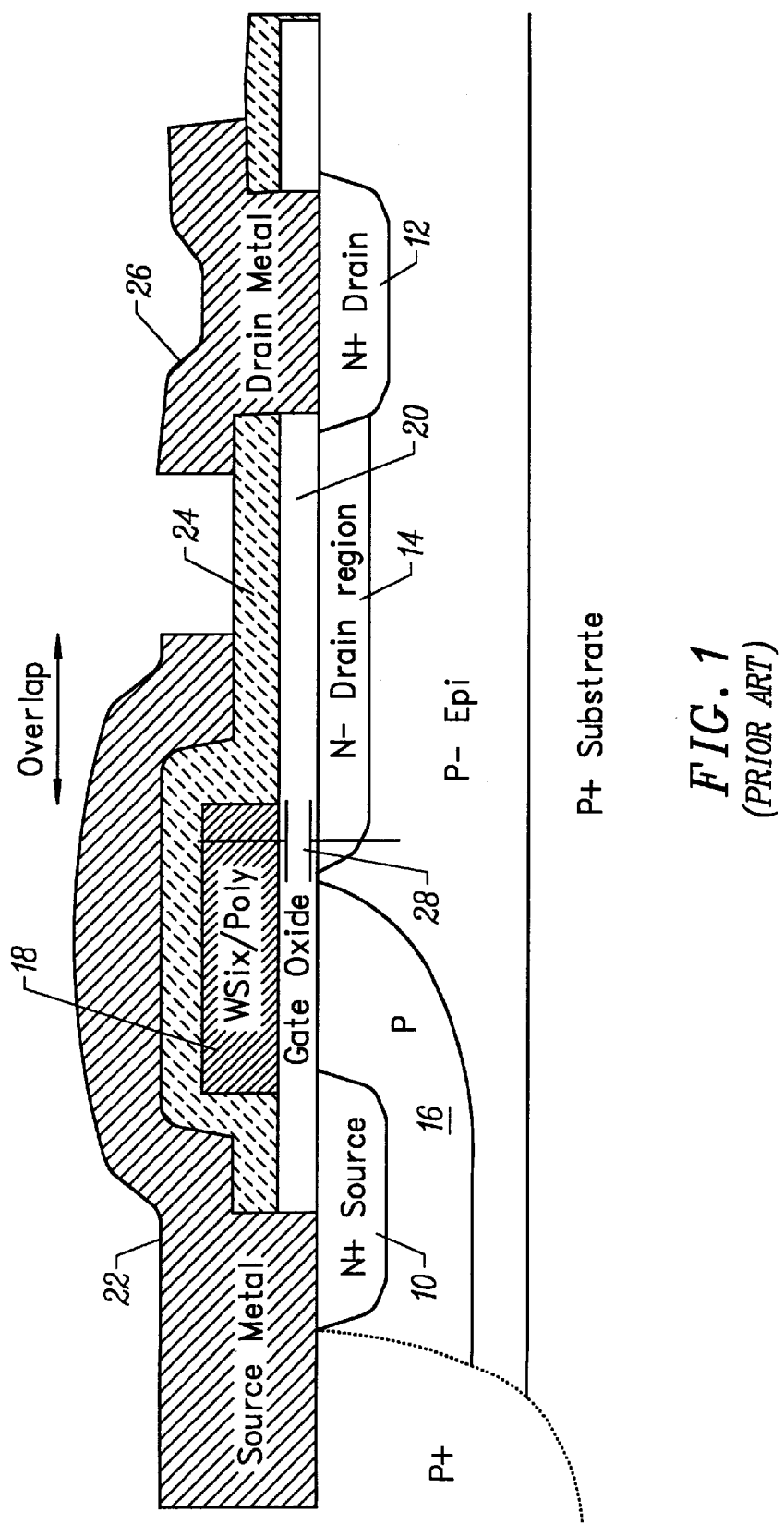
FIG. 1 and FIG. 2 are section views illustrating prior art LDMOS structures having Faraday shields.
Figure 2:
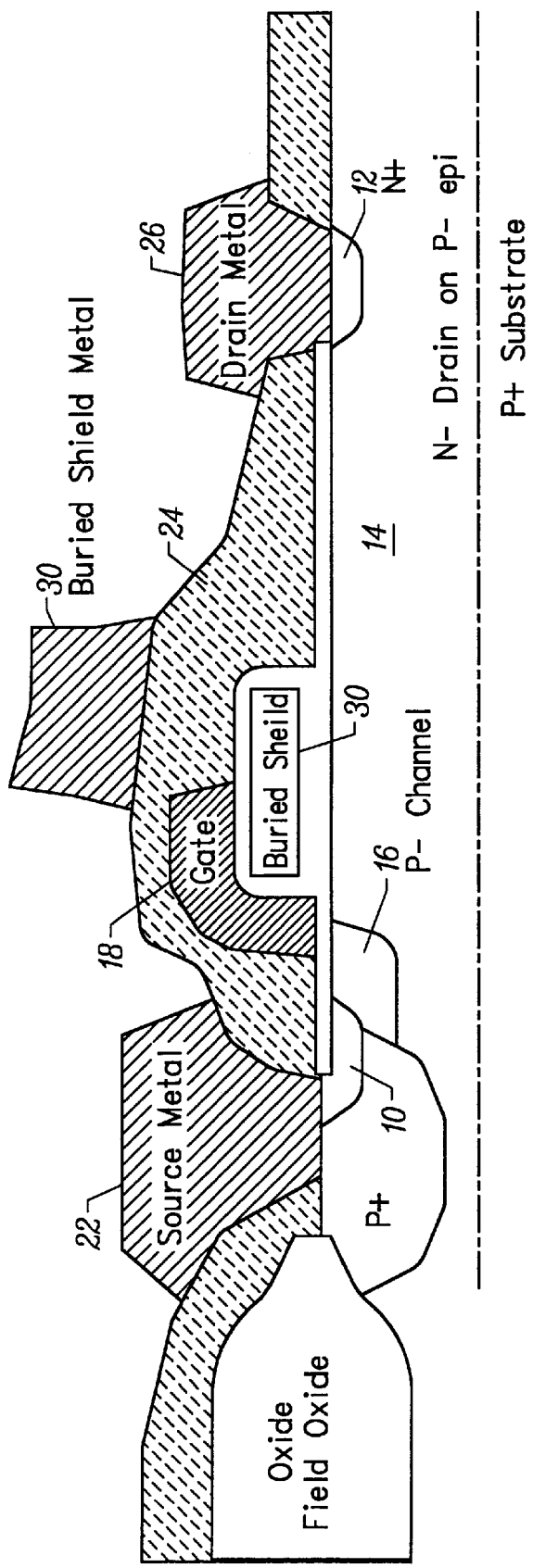
Figure 3C:
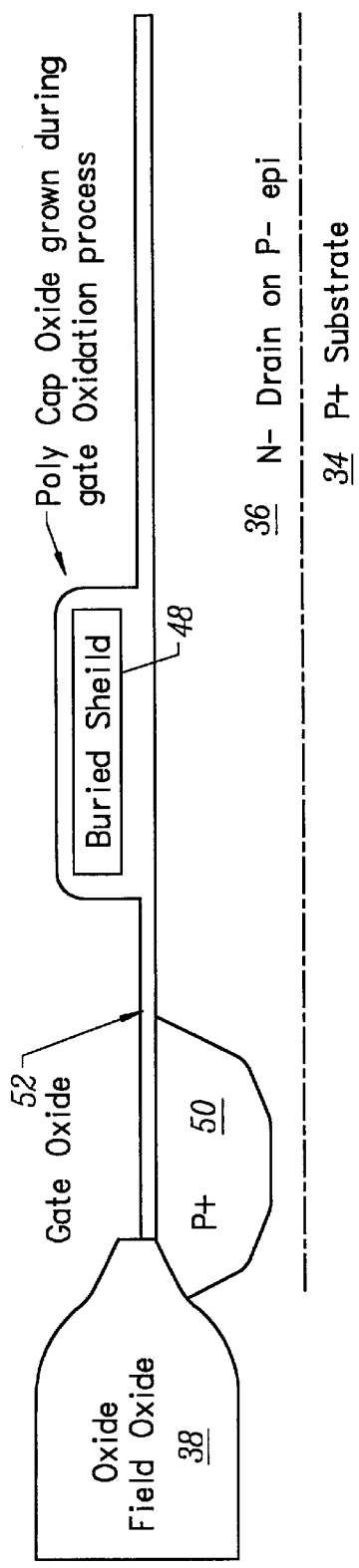

Referring now to the drawing, FIGS. 3A–3I are section views illustrating the fabrication of an LDMOS transistor in accordance with one embodiment of the invention. As shown in FIG. 3A, the process begins with a P+ silicon substrate 34 with an N− drain region 36 formed in P-epitaxial silicon layer 36. Standard field oxidation provides field oxide 38 with a thin layer of silicon oxide 40 extending over the N− drain layer 36. An optional deep P+ sinker can be formed for a grounded source LDMOS device (not shown). Further, the N− drain region formation can be formed before the field oxidation or after field oxidation but it must be formed prior to the buried shield plate fabrication. The silicon oxide growth 40 over the active area is typically 1000–5000 Å in thickness. An N+ doped polysilicon layer 42 is then formed over the surface of the device to a thickness of 1000–5000 Å and can be either doped or undoped polysilicon.

Alternatively, a polycide stack or a high temperature metal such as tungsten can be employed in forming the shield layer 42. If the shield material is not doped in-situ during deposition of the conductor, buried shield doping such as N+ arsenic is implanted with a dose of 1E15–1E16 cm-3. A dielectric layer 44 is then formed over the surface of the doped layer 42 with a thickness of 1–2000 Å of oxide, oxynitride, or oxide and nitride combination.

Referring now to FIG. 3B the buried shield is patterned using a photoresist mask 46, and then as shown in FIG. 3C the buried shield 48 is defined by a selective etch. An oxide etch is then employed to expose the active area for the transistor and strip the resist 46. A deep P+ implant 50 is made to lower the beta of a parasitic NPN device in the resulting structure. Gate oxide 52 is then formed to a thickness of 100 to 1000 Å with 500–700 Å preferred. The oxide also forms over buried shield 48. The oxide on top of shield plate 48 may be thicker than the oxide over the active area since N+ polysilicon oxidizes faster than low-doped or P doped silicon. For a 700 Å gate oxidation process, the oxide on top of the buried shield is approximately 1,150 Å.

Figure 3D:
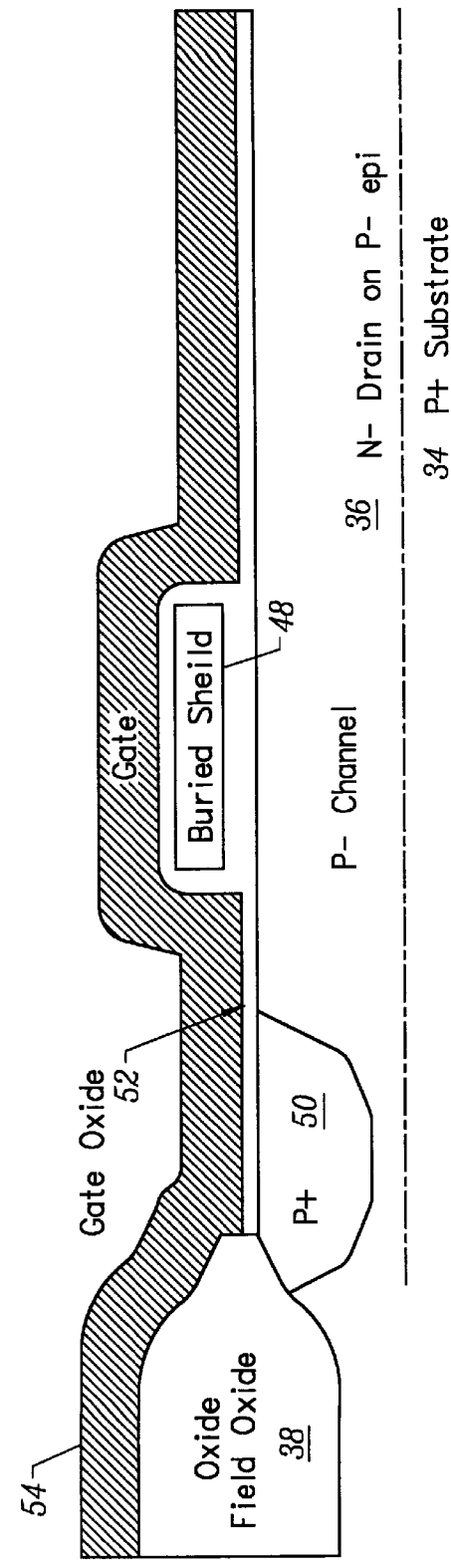

As shown in FIG. 3D, blanket gate material 54 is deposited over the surface of the structure such as by chemical vapor deposition of tungsten, tungsten silicide, or other materials such as a thin layer (500 Å) of polysilicon with tungsten silicide (2–5 KÅ) on top.

In FIG. 3E a blanket anisotropic dry etch (RIE for example) is employed to form self-aligned gate 54 along the periphery of the N+ shield plate 48.

FIGS. 4A and 4B are plan views of the resulting gate material 54 with FIG. 4A not employing a mask to pattern the gate while in FIG. 4B a mask is used to pattern the gate and provide a gate contact area.

Figure 3F:
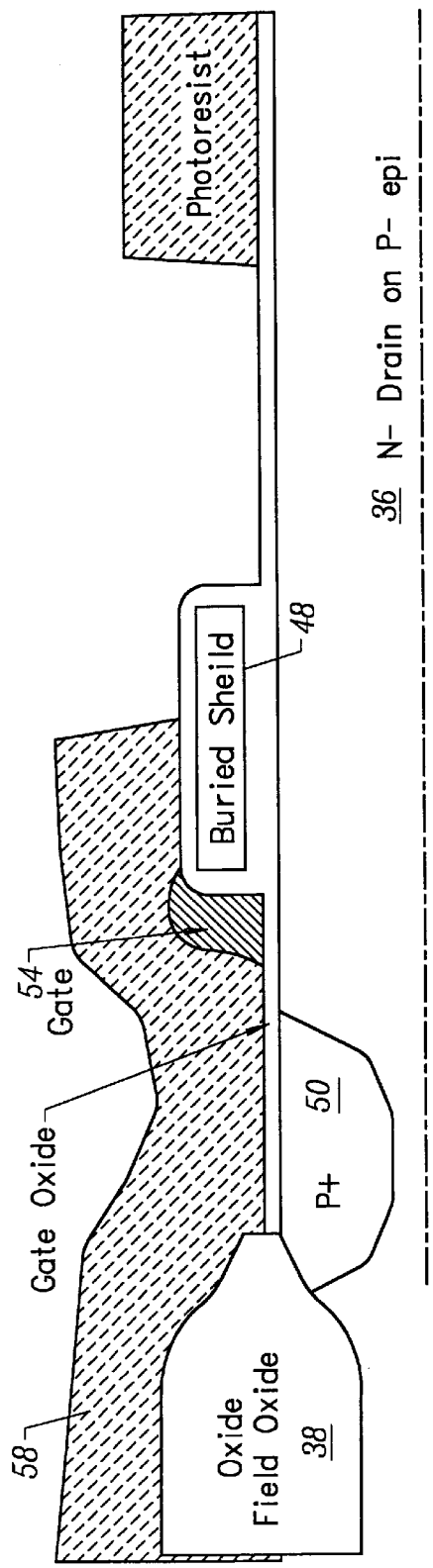

In FIG. 3F a non-critical mask of photoresist 58 is used to protect the gate 54 on the source side of the buried shield plate 48, and then the exposed gate material is removed on the drain side of the gate by a selective etch such as isotropic dry etch.

Figure 3G:
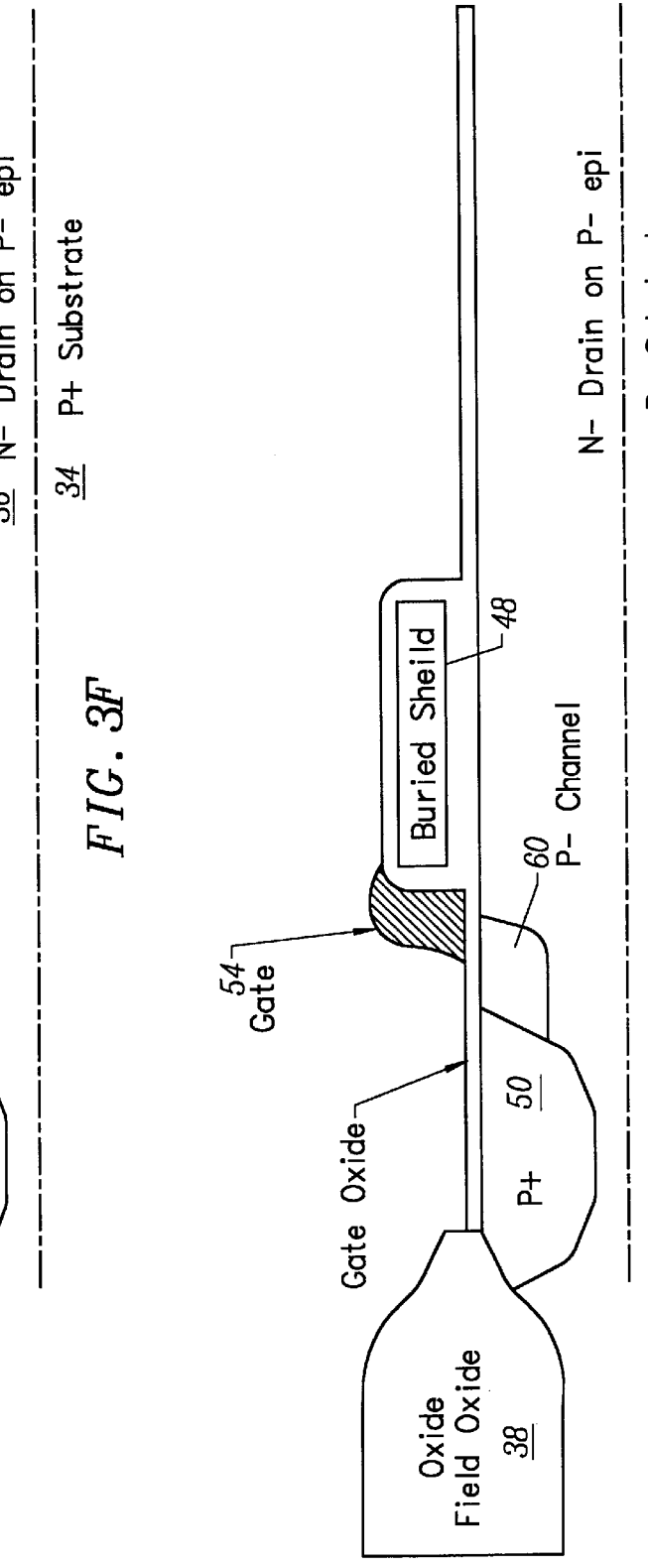
Figure 3H:
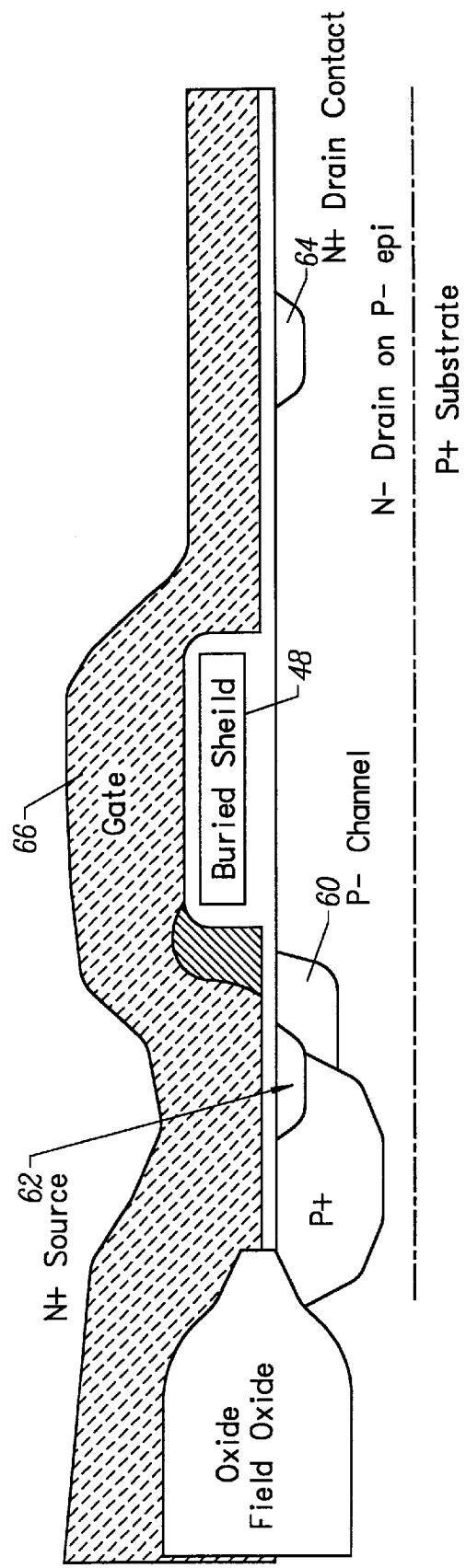

In FIG. 3G a P-channel 60 is formed by using a P channel mask dopant implant and drive-in with the dopant ions extending from P+ region 50 under the gate 54. In FIG. 3H, N+ source and drain contact regions 62, 64 are implanted and annealed, and then a dielectric layer 66 is then deposited over the surface of the structure. BPSG glass with reflow is preferred, or an oxide/nitride stack can be employed for the dielectric 66.

Figure 3I:
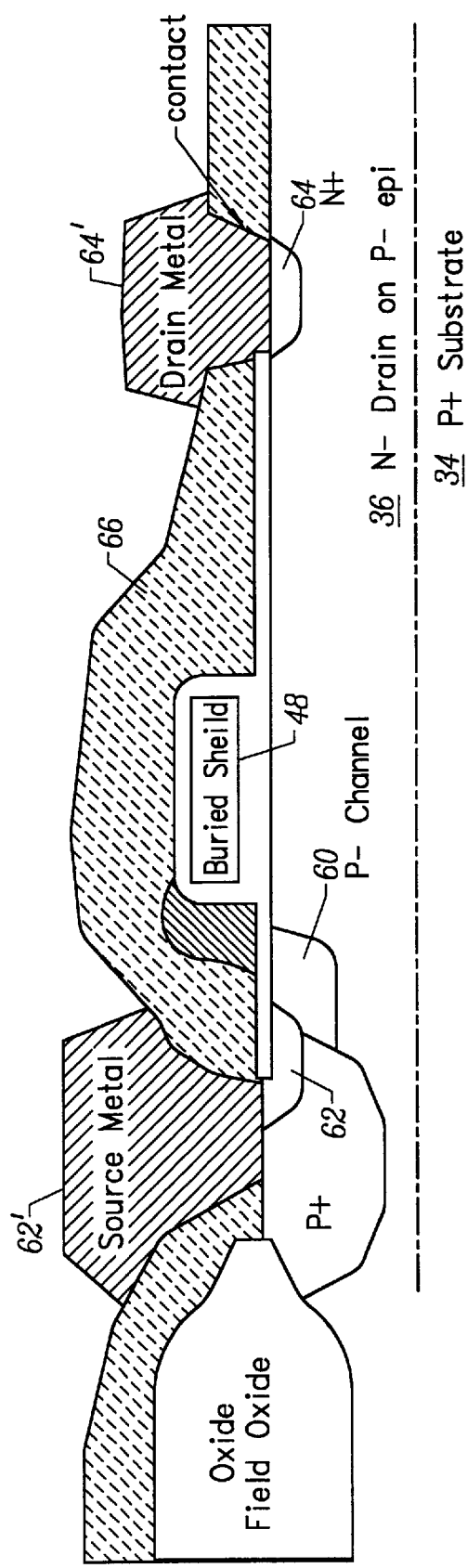

Finally, as shown in FIG. 3I the device is completed by contact mask and etch with source metal $62^1$ and drain metal $64^1$ contacting source and drain regions 62, 64 respectively. The gate-drain capacitance is minimized even though the gate is relatively wide to allow for metal interconnect strapping.

Figure 5A:
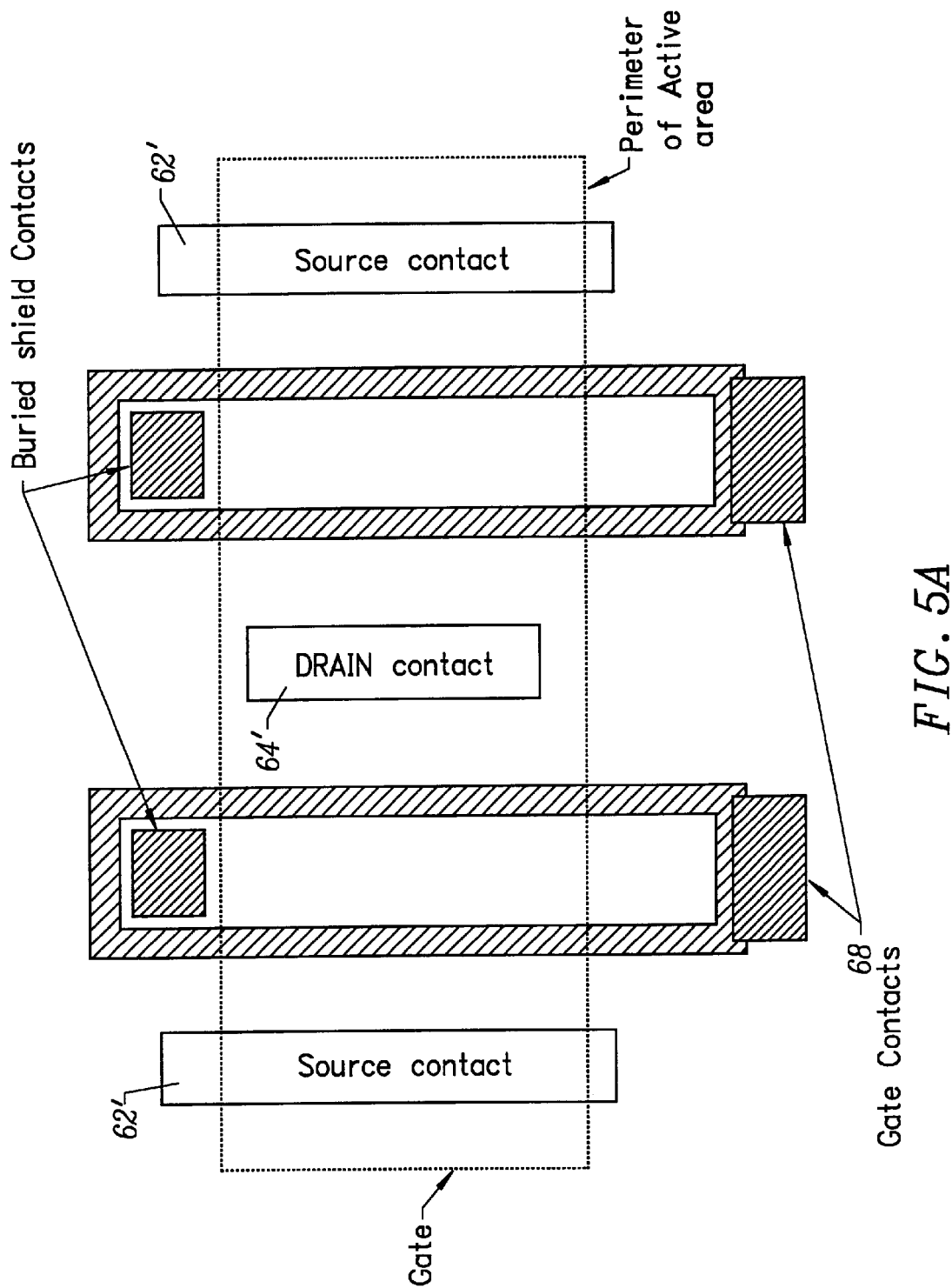
FIGS. 5A and 5B are plan views illustrating finished LDMOS transistors as fabricated in FIGS. 3A–3I.
Figure 5B:
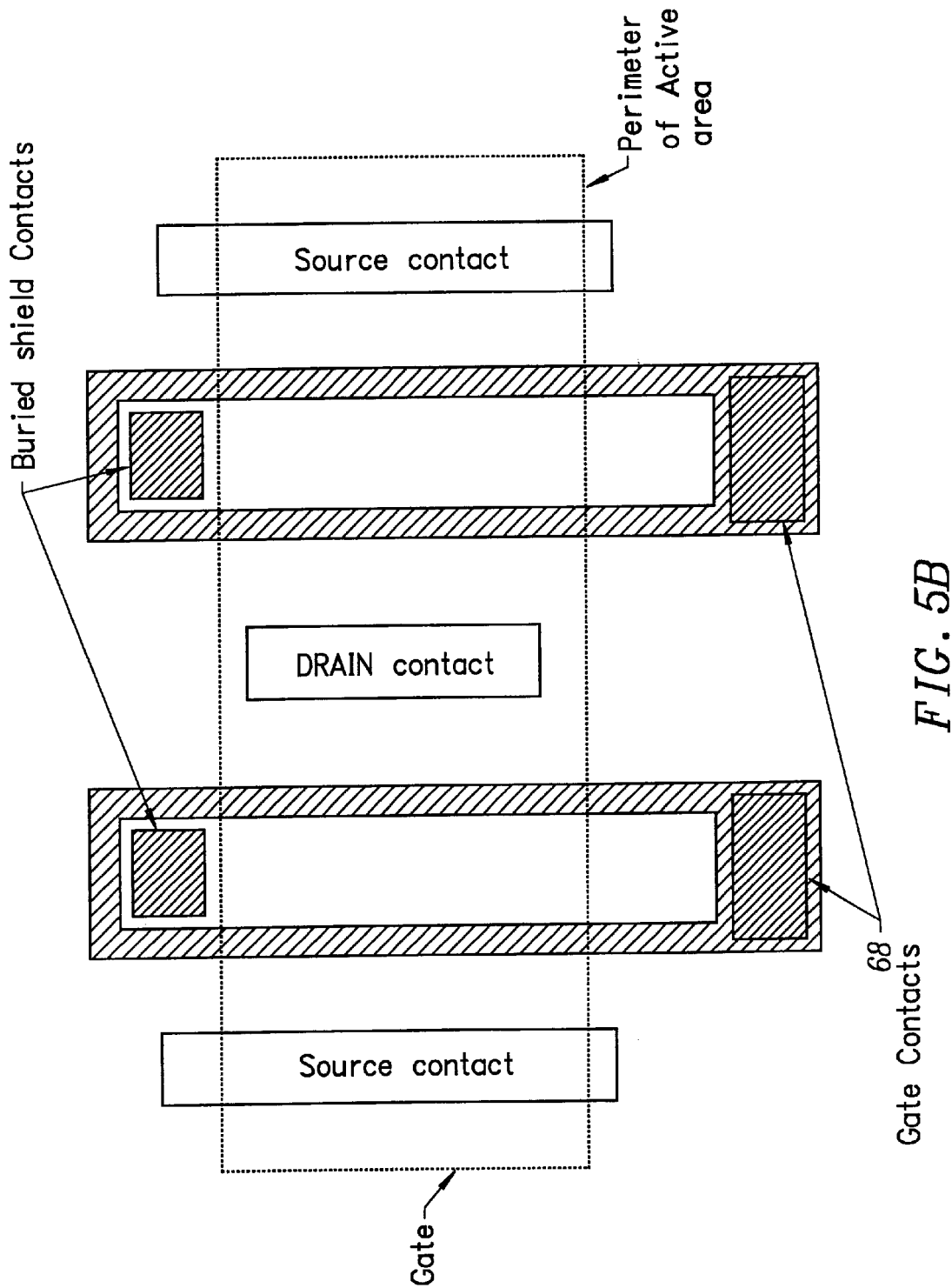

FIGS. 5A, 5B are plan views of the finished device of FIG. 3I in accordance with different gate masks. In FIG. 5A an optional gate mask is not employed, and the gate contact 68 overlaps the gate and thick field oxide. In FIG. 5B an optional gate mask is employed whereby the gate contact is formed on the gate area patterned over the thick field oxide.

Figure 6:
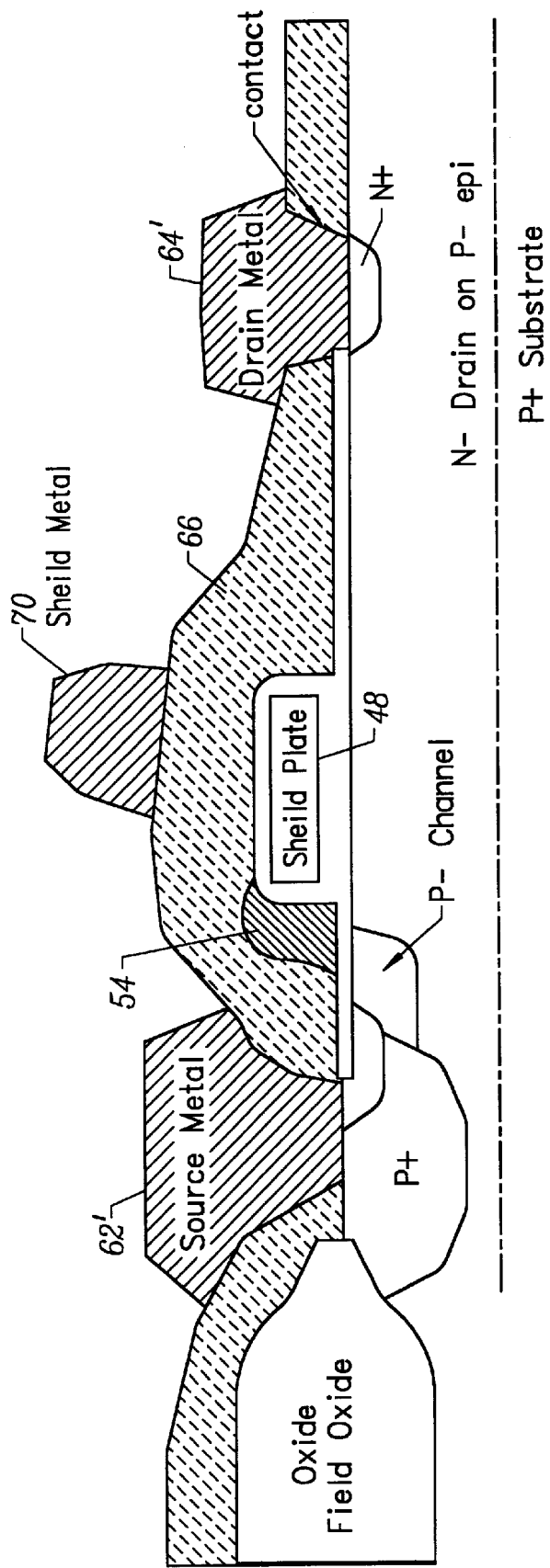
FIG. 6 is a section view illustrating a LDMOS transistor in accordance with another embodiment of the invention.

FIG. 6 is another embodiment of the LDMOS structure in accordance with the invention which is similar to FIG. 3I but includes an additional shield metal 70 on dielectric 66 over shield plate 48. The shield metal runs parallel to and on top of the shield plate 48 but does not overlap gate 54, which minimizes any increase in the input capacitance. The additional shield plate 70 further minimizes the gate-drain capacitance by shielding any capacitance between the drain metal $64^1$ and the gate 54.

Figure 7:
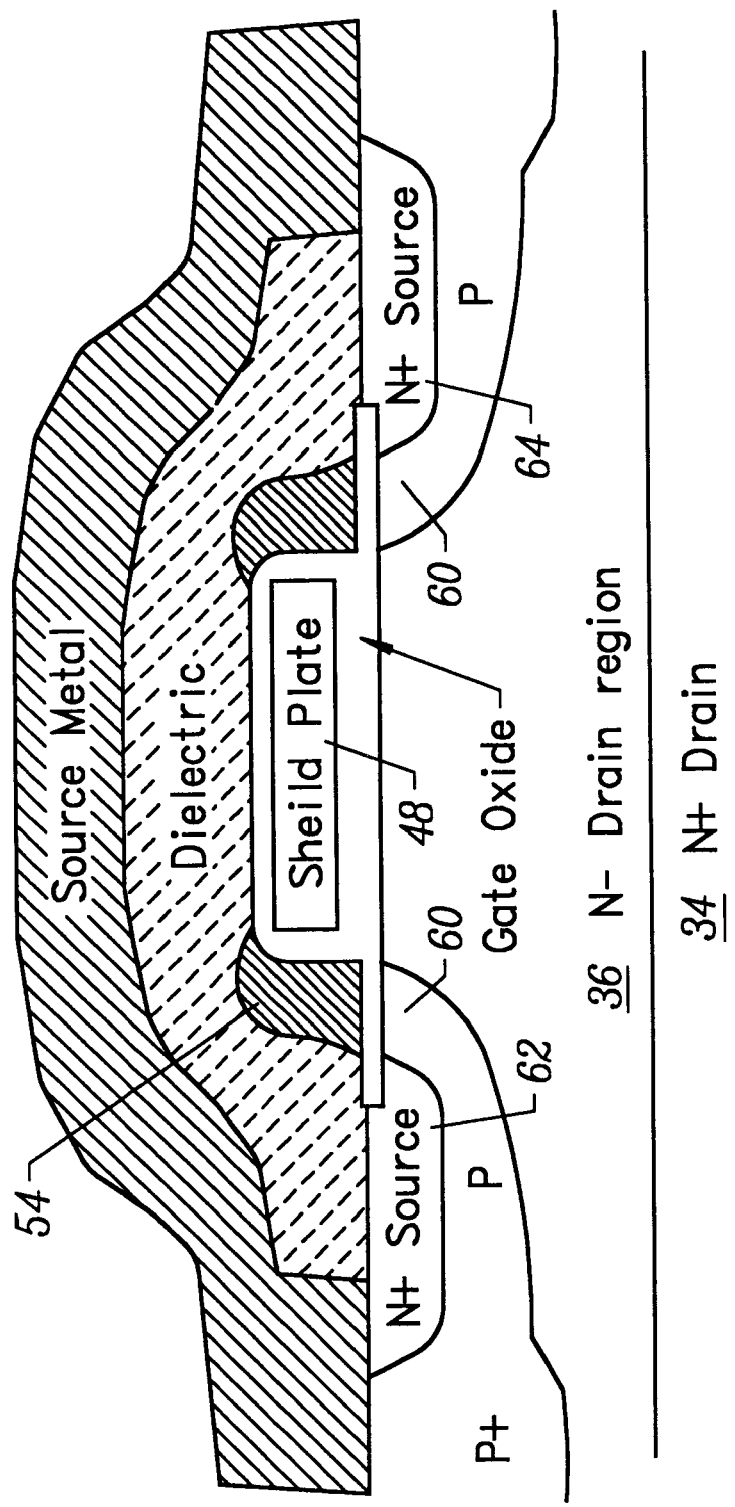
FIG. 7 illustrates a vertical DMOS transistor in accordance with one embodiment of the invention.

FIG. 7 is a section view of another embodiment of the invention for a vertical DMOS transistor. In this embodiment the channel 60 surrounds shield plate 48 with the gate 54 also surrounding shield plate 48 and positioned over channel 60. The device is built in an N+ substrate which becomes the drain of the vertical transistor structure. A process similar to the LDMOS process is employed with the polysilicon shield plate deposited and patterned before definition of the gate electrode. Again, the gate-drain capacitance is effectively shielded.

There has been described several embodiments of MOSFET transistor structures in which shield plates more effectively shield the gate and drain of the transistor. While the invention has been described with reference to specific embodiments, the description is illustrative of the invention and is not to be construed as limiting the invention. Various modifications and applications may occur to those skilled in the art without departing from the spirit and scope of the invention as defined by the appended claims.

What is claimed is:

1. A lateral MOS transistor comprising
a semiconductor substrate having a major surface,
a source region and a drain region formed in the major surface and spaced apart by a channel region,
a shield plate formed on said major surface over a portion of the drain region and adjacent to the channel region, the shield plate extending above the major surface and insulated therefrom by a dielectric, and
a gate positioned over the channel region and abutting a side of the shield plate facing the source region, the gate having minimal or no overlap of the shield plate.

2. The lateral MOS transistor as defined by claim 1 wherein the gate is formed on the periphery of the shield plate by a self-aligned deposition and etch of gate material.

3. The lateral MOS transistor as defined by claim 1 and further including a contact to the shield plate formed on the major surface.

4. The lateral MOS transistor as defined by claim 3 and further including a contact to the gate formed on the major surface.

5. The lateral MOS transistor as defined by claim 1 wherein the substrate includes a P+ substrate and a P− epitaxial layer, the source and drain regions comprising N+ doped regions in the major surface.

6. The lateral MOS transistor as defined by claim 5 wherein the drain further includes an N− region extending from the N+ doped drain region to the channel region and under the shield plate.

7. The lateral MOS transistor as defined by claim 6 wherein the transistor comprises a LDMOS transistor.

8. The lateral MOS transistor as defined by claim 7 and further including a shield metal overlying the shield plate and insulated therefrom.

9. The lateral MOS transistor as defined by claim 1 and further including a contact to the shield plate and means for applying a voltage potential to the contact.

10. The lateral MOS transistor as defined by claim 9 wherein the voltage potential is ground.

11. A vertical MOS transistor comprising
a semiconductor substrate of first conductivity type having first and second major opposing surfaces,
a doped region of a second conductivity type formed in the first surface, the doped region surrounding a surface area of the semiconductor substrate of first conductivity type,
a source region of the first conductivity type formed in the doped region and spaced from the surface area of the semiconductor substrate by a channel region within the doped region,
a shield plate overlying the surface area and adjacent to the channel region, the shield plate extending above the surface area and insulated therefrom by dielectric, and
a gate positioned over the channel region and abutting the shield plate, the gate having minimal or no overlap of the shield plate,
whereby the substrate functions as a drain for the transistor.

12. The vertical MOS transistor as defined by claim 11 wherein the gate is formed on the periphery of the shield plate by a self-aligned deposition and etch of gate material.

13. The vertical MOS transistor as defined by claim 11 wherein the substrate comprises an N+ doped substrate and N− doped epitaxial layer.

14. The vertical MOS transistor as defined by claim 11 and further including a contact to the shield plate and means for applying a voltage potential to the contact.

15. The vertical MOS transistor as defined by claim 14 wherein the voltage potential is ground.

\* \* \* \* \*